United States Patent [19]

Tajima et al.

[11] Patent Number: 5,398,128
[45] Date of Patent: Mar. 14, 1995

[54] WIRING BOARD FOR USE IN A LIQUID CRYSTAL PANEL AND METHOD OF MAKING INCLUDING FORMING RESIN OVER SLIT BEFORE BENDING

[75] Inventors: Naoyuki Tajima, Kita-Katsuragi; Takaaki Tsuda, Tenri, both of Japan

[73] Assignee: Sharp Kabushiki Kaisha, Osaka, Japan

[21] Appl. No.: 868,561

[22] Filed: Apr. 15, 1992

[30] Foreign Application Priority Data

May 21, 1991 [JP] Japan .................. 3-035603 U

[51] Int. Cl.⁶ .................. G02F 1/1333; G02F 1/1335
[52] U.S. Cl. ........................... 359/82; 359/62
[58] Field of Search ............... 359/62, 82, 88; 156/901, 902

[56] References Cited

U.S. PATENT DOCUMENTS

| | | | |
|---|---|---|---|
| 4,597,635 | 7/1986 | Hoshikawa | 359/83 |
| 4,684,974 | 8/1987 | Matsunaga et al. | 357/68 |
| 4,887,149 | 12/1989 | Romano | 357/81 |
| 4,949,158 | 8/1990 | Ueda | 357/68 |
| 4,967,260 | 10/1990 | Butt | 357/70 |
| 5,018,005 | 5/1991 | Lin et al. | 357/80 |

FOREIGN PATENT DOCUMENTS

| | | | |
|---|---|---|---|
| 59-116616 | 7/1984 | Japan | 359/62 |
| 61-6832 | 1/1986 | Japan . | |
| 61-8960 | 1/1986 | Japan . | |
| 63-250849 | 10/1988 | Japan . | |
| 64-61981 | 3/1989 | Japan | 156/901 |

OTHER PUBLICATIONS

IBM Technical Disclosure Bulletin, vol. 32, No. 2, Jul. 1989–"Tab Tape Structure for Area Array Tab"–pp. 305–306.

IBM Technical Disclosure Bulletin, vol. 33, No. 10B, Mar. 1991–"Stress Relief Method for Tab Modules'-'–pp. 158–159.

*Primary Examiner*—Anita Pellman Gross
*Attorney, Agent, or Firm*—Nixon & Vanderhye

[57] ABSTRACT

A board for installation in a liquid crystal panel with at least one slit at a portion thereof to be bent has a resin coating applied to a bridge portion of a conductive pattern formed over the slit. The resin coating resists external load applied during bending of the board. This board may be made by a method having the steps of punching a slit in the board corresponding to a position where the board is to be bent; forming a metal laminate on the board; forming a conductive pattern by etching the metal laminate; applying a resin coating capable of resisting an external load, which is applied during subsequent bending of the board, onto the conductive pattern across the slit; and curing the resin coating. The board is thereafter bent and installed in a liquid crystal panel.

16 Claims, 6 Drawing Sheets

WIRING BOARD FOR USE IN A LIQUID CRYSTAL PANEL AND METHOD OF MAKING INCLUDING FORMING RESIN OVER SLIT BEFORE BENDING

BACKGROUND OF THE INVENTION

1. Field of the Invention

This invention relates to wiring board in general, such as a film carrier, a flexible printed wiring board or a rigid printed wiring board, which are installed on a module, e.g. a liquid crystal panel. Further, this invention relates to a method of making those wiring boards and to a liquid crystal panel on which such a wiring board is installed.

2. Description of the Related Art

A film carrier board for a liquid crystal driver on a liquid crystal panel is conventionally made with one or more slits where the board is to be bent. Along the slit, the board material is absent, and the conductive patterns of copper or the like are exposed. If any external force is applied to this slit portion, an open circuit is likely to occur. Methods used to prevent this open circuit reinforce the mechanical strength of the conductive patterns or contemplate the bending angle and condition. Also, the bent portion of the board is sometimes divided into subdivisions to shorten the exposed length. After the film carrier board is bent and installed on a liquid crystal panel (Cf. FIG. 7), the bent portion is coated with a silicone-based resin or the like for reinforcement (Cf. FIG. 8).

The prior art techniques mentioned above have a number of problems. The method of subdividing the portion to be bent, since there is a limit to the slit size permissible on the board (min. 0.7 mm width, ordinarily), requires a longer bent portion if the number of subdivisions is increased. Therefore more film carrier has to be used, resulting in an increased cost of the film carrier. Compact bending is also given up. Reinforcing the bent portion with the resin after the film carrier is bent and installed on a liquid crystal panel requires considerable time and labor for resin application and curing, which incurs a cost increase.

SUMMARY OF THE INVENTION

It is therefore an object of the present invention to provide a board which prevents breaking the conductive patterns of copper or the like exposed at a bent portion of the board when external force is applied to the bent portion and also to provide a liquid crystal panel having the above-mentioned board installed thereon. According to the present invention, the above object can be achieved by applying a resin coating capable of resisting an external load, which is applied during bending of the board, onto the conductive pattern across the slit of the board at a part of the board which corresponds to a portion to be bent.

The present invention includes a method of making a board having at least one slit and providing a liquid crystal panel on which this board is installed, the method comprising the steps of:

punching a part of said board, which corresponds to a portion to be bent, to form at least one slit;

forming a metal laminate on said board;

forming a conductive pattern on said board by etching the metal laminate having the slit formed;

applying a resin coating capable of resisting an external load, which is applied during bending of said board, onto the conductive pattern across the slit of said board; and curing said resin coating applied to the conductive pattern.

According to the present invention, the conductive pattern at the portion to be bent is protected by a resin, and therefore, when the board is bent, the conductive pattern can be prevented from being cut off, even if the bent portion of the element-installed board is subjected to an external force. If the solder resist conventionally printed on the pattern to improve the electrical insulation and to protect the pattern is replaced with a soft material and if this soft protective resin coating is printed to the bent portion simultaneously with printing on other parts, no additional step is necessary and a board according to the present invention can be produced at cost equal to that of ordinary boards. According to the present invention, a coating is applied to a flat board and this coating step is easier than the conventional coating step which is done after the board has been bent, and since, in this invention, this coating step is included in the making process, accurate positioning is possible.

Further objects and advantages of the present invention will be apparent from the following description of the preferred embodiments of the invention as illustrated in the accompanying drawings.

DESCRIPTION OF THE PREFERRED EMBODIMENTS

Referring to the accompanying drawings, description will be made of preferable embodiments of the present invention in which a film carrier package for a liquid crystal driver is installed in a bent state.

Figure 1A:
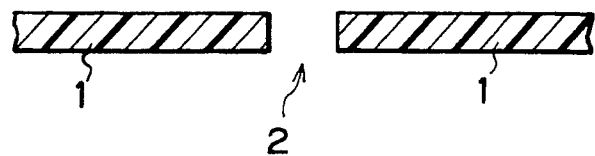
FIGS. 1a–1d are a schematic making process drawings of a preferable embodiment according to the present invention.
Figure 1B:
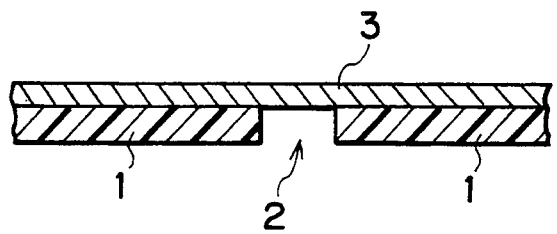
Figure 1C:
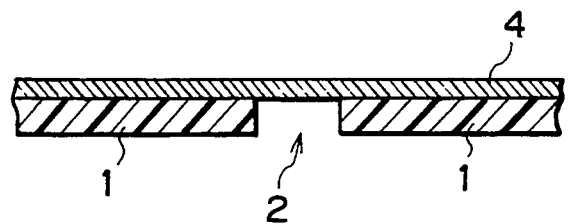
Figure 1D:
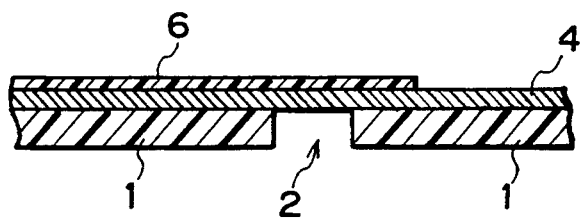
Figure 2:
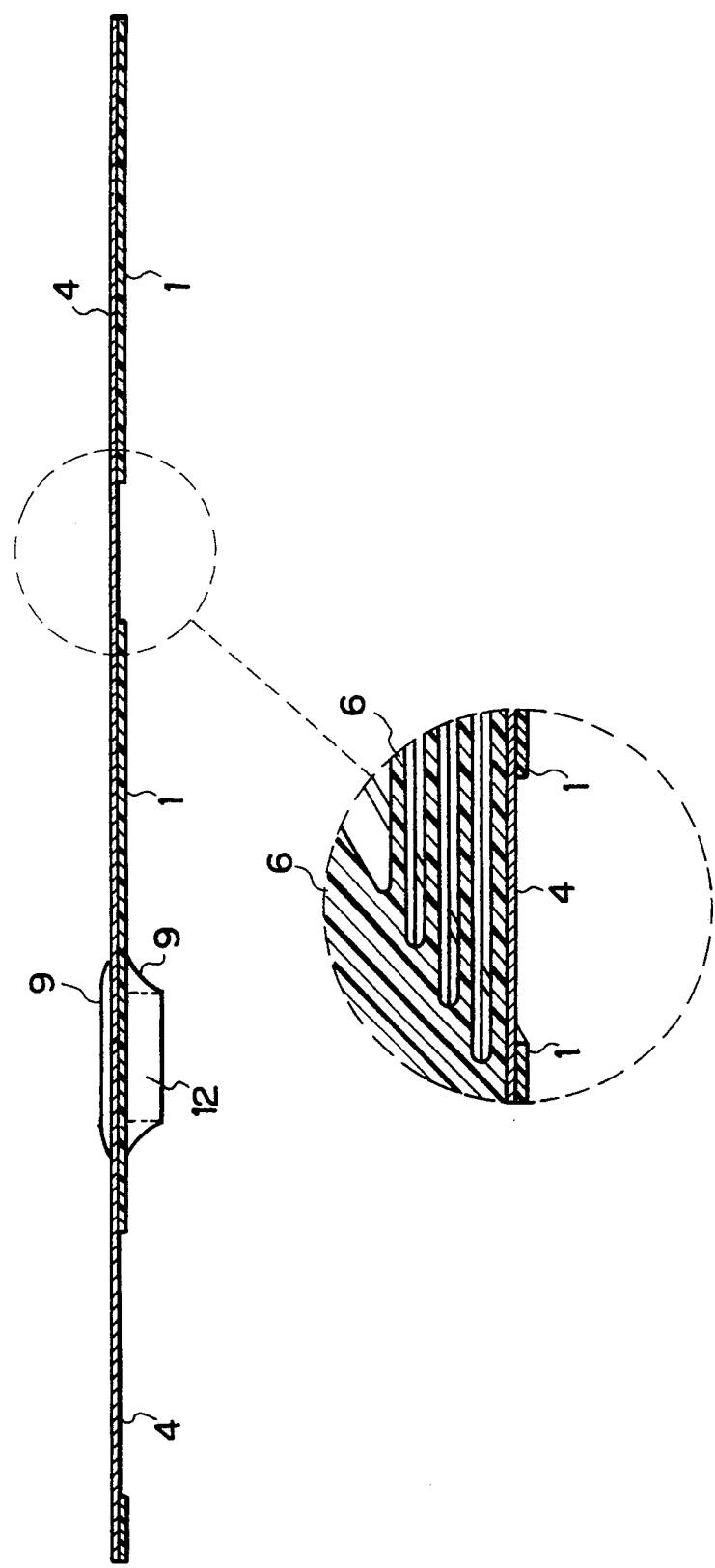
FIG. 2 is a sectional view of a board produced by the method according to the making process shown in FIG. 1.
Figure 3:
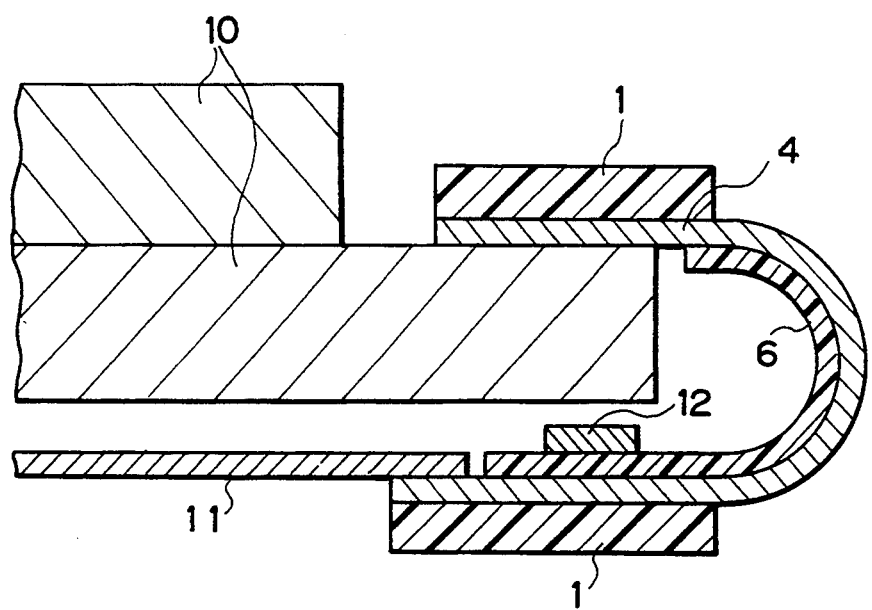
FIG. 3 is a sectional view of a device-installed board produced by the method according to the making process shown in FIG. 1.
Figure 4A:
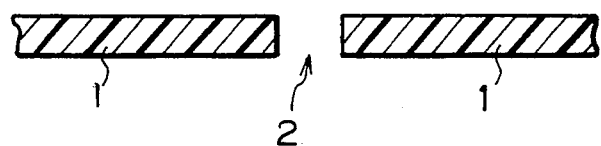
FIGS. 4a–4d are a schematic making process drawings of another preferable embodiment according to the present invention.
Figure 4B:
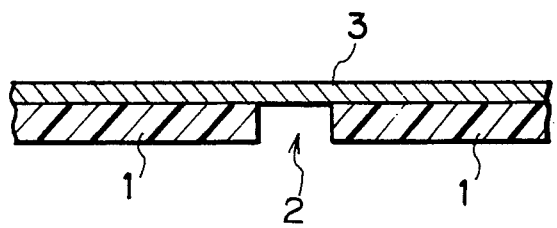
Figure 4C:
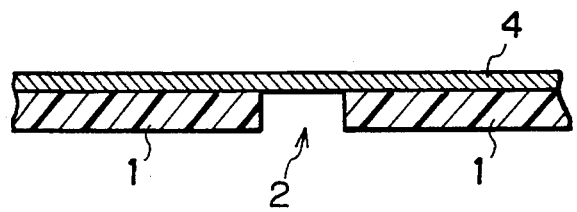
Figure 4D:
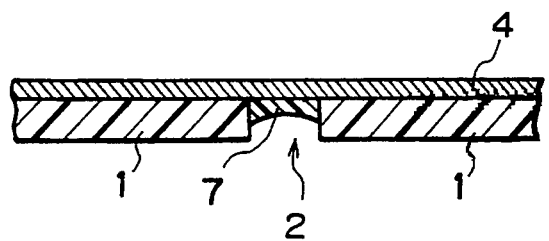
Figure 5:
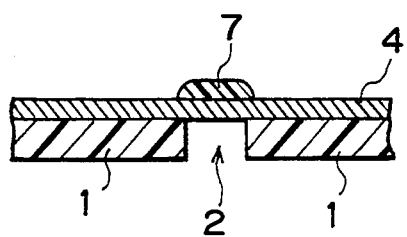
FIG. 5 is alternative example of the final step of the making process shown in FIG. 4.

FIG. 1 schematically shows a step of laminating the conductive pattern with a flexible dry film resist 6 in the making process of a film carrier. By punching the portion of the board film 1 to be bent, at least one slit 2 (1 to 3 mm × 10 to 40 mm) is provided at the portion to be bent, a copper foil laminate 3 is formed on the board film 1 having the slit formed, and by etching the copper foil 3, conductive patterns 4 are formed on the board 1. The conductive patterns 4 are laminated with a dry film resist 6, and finally, the resin constituting the dry film resist 6 is cured. FIG. 2 shows a thus produced film carrier package, and FIG. 3 shows this film carrier package to be installed on a liquid crystal panel 10 in a bent state. The conductive pattern 4 exposed at the bent portion of the board film 1 is laminated with a flexible dry film resist 6, and is also provided with a semiconductor chip 12 and a printed wiring board (PWB) 11. The semiconductor chip 12 is usually sealed with resin.

A liquid resist may be used instead of above-mentioned dry film resist laminate. In addition, for after treatment, it is possible to perform a well-known step (Sn plating, for example). In this case, the above-mentioned resist application may be done either before or after this plating step.

FIG. 4 schematically shows a process of applying a flexible resin (e.g. low-temperature-cured polyimide solder resist) 7 onto the pattern in another making process of a tape carrier. The making process is carried out by following the same process steps mentioned above, only difference being the use of a step of applying a flexible resin 7 by suitable means, such as casting, printing and transfer instead of laminating the conductive pattern with a flexible dry film resist 6 in the process described with reference to FIG. 1. In this resin application, it is possible to adopt a method (1) applying a resin on the base side (slit side) before the conductive pattern is formed or (2) applying a resin simultaneously with solder printing after the conductive pattern is formed (screen printing) or use both methods (1) and (2).

Figure 6:
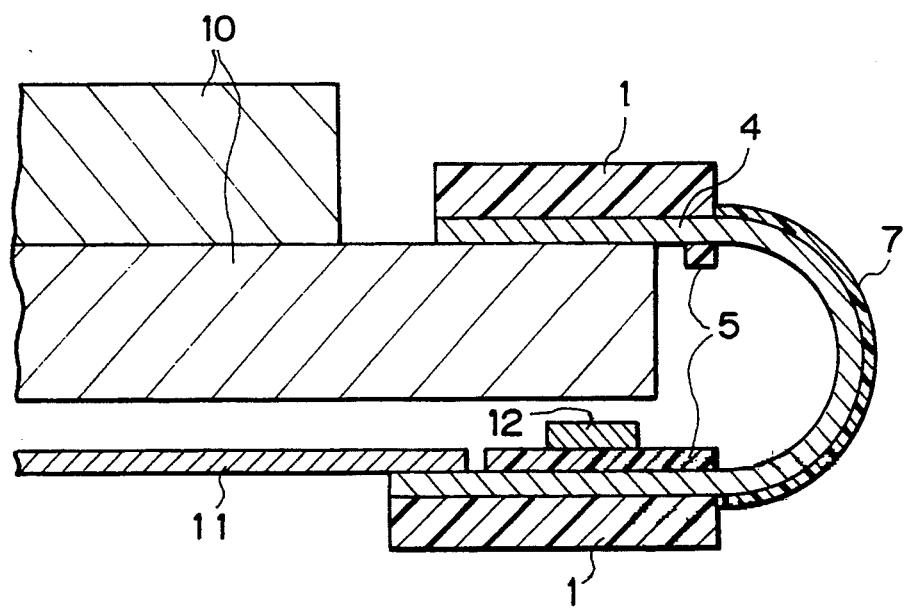
FIG. 6 is a sectional view of a device-installed board produced by the method according to the making process shown in FIG. 4.

FIG. 6 shows a thus produced film carrier package to be installed on a liquid crystal panel 10 in a bent state. The conductive pattern 4 exposed at the bent portion of the board film 1 is applied with a flexible resin 7. In addition, as has been done conventionally, a solder resist 5 was applied to the conductive pattern 4 for protection. Similarly, a semiconductor chip 12 and a printed wiring board (PWB) 11 were installed.

The other types of boards may be used in embodying the present invention, for example, a flexible printed wiring board, and a rigid printed wiring board. And resin materials that may be used in embodying the present invention are those which have flexibility sufficient to withstand bending after the curing step, such as epoxy, polyimide, silicone, urethane, acrylic and polyamide resins or a diene rubber.

Figure 7:
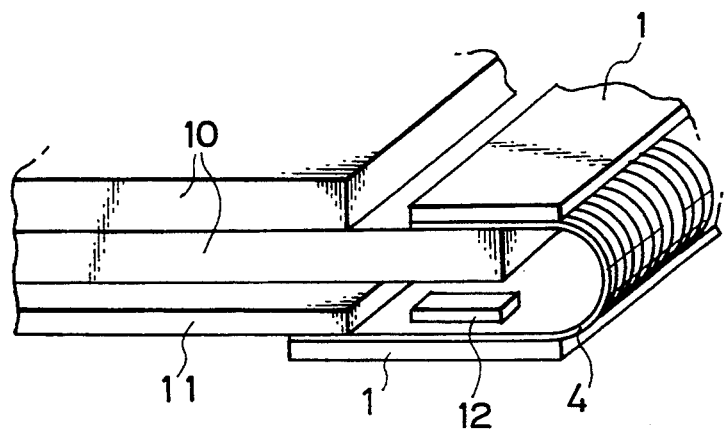
FIG. 7 is a perspective view of a device-installed board produced by a prior-art method.
Figure 8:
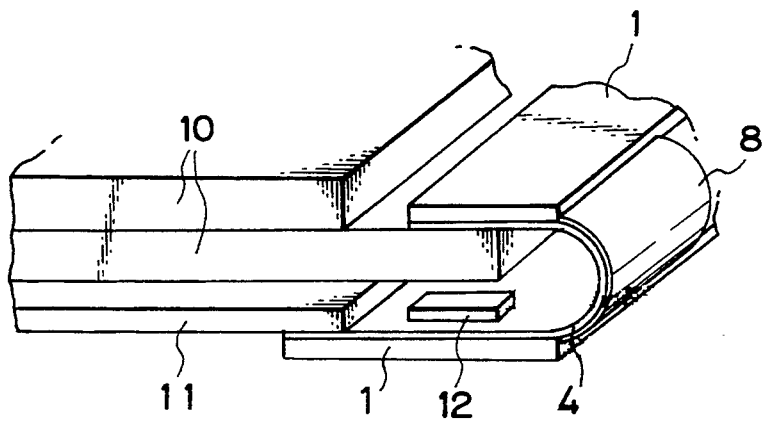
FIG. 8 is a perspective view of a device-installed board reinforced the bent portion thereof, produced by a prior-art method.

FIGS. 7 and 8 show examples of device-installed board produced by the prior-art methods. FIG. 8 shows a film carrier 1 in which a reinforcing resin 8 was applied to the conductive pattern 4 exposed at the bent portion of the film carrier 1.

Many widely different embodiments of the present invention may be constructed without departing from the spirit and scope of the present invention. It should be understood that the present invention is not limited to the specific embodiments described in the specification, except as defined in the appended claims.

What is claimed is:

1. A board selected from one of a film carrier, a flexible printed wiring board, and a hard printed wiring board, comprising:
   a slit in the board;
   a conductive pattern formed on the board and bridging the slit; and
   a resin coating formed continuously on the conductive pattern covering the board and bridging the slit, wherein the resin coating is capable of resisting an external load applied during subsequent bending of said board at the slit.

2. A board according to claim 1, wherein said resin coating is made from a resin selected from a group of epoxy, polyimide, silicone, urethane, acrylic, and polyamide resins.

3. A board according to claim 1, wherein said resin coating is formed by laminating the conductive pattern with a flexible dry film.

4. A board according to claim 1, wherein said resin coating is formed by laminating the conductive pattern with a flexible liquid resist.

5. A method of making a board selected from one of a film carrier, a flexible printed wiring board, and a hard printed wiring board, comprising the following sequential steps:
   (1) punching a part of the board to form at least one slit in the board at a position where the board is to be bent;
   (2) forming a metal laminate on the board that covers the slit;
   (3) etching the metal laminate to create a conductive pattern on the board, a portion of the conductive pattern bridging the slit;
   (4) applying a resin coating to the conductive pattern bridging the slit that is capable of resisting an external load applied during bending of the board;
   (5) curing the resin coating; and
   (6) thereafter bending the board at the slit wherein the resin coating protects and reinforces the bridging conductive pattern.

6. A method of making a board according to claim 5, wherein said resin coating is performed by screen printing.

7. A method of making a board according to claim 5, wherein said resin coating is a flexible resin.

8. A method of making a board according to claim 7, wherein said flexible resin is made from a resin selected from group of epoxy, polyimide, silicone, urethane, acrylic and polyamide resins.

9. A method of making a board according to claim 5, wherein said resin coating is formed by laminating with a flexible dry film resist.

10. A method of making a board according to claim 5, wherein said resin coating is formed by laminating with a flexible liquid film resist.

11. A method of making a board selected from one of a film carrier, a flexible printed wiring board, and a hard printed wiring board, comprising the following sequential steps:
   (1) punching a part of the board to form at least one slit in the board at a position where the board is to be bent;
   (2) forming a metal laminate on the board that covers the slit;
   (3) etching the metal laminate to create a conductive pattern on the board, a portion of the conductive pattern bridging the slit;
   (4) applying a resin coating to the conductive pattern bridging the slit that is capable of resisting an external load applied during bending of the board; and
   (5) curing the resin coating;
wherein the resin coating applied onto the conductive pattern bridging the slit is also applied at the same time onto other areas of the conductive pattern.

12. A method of making a board according to claim 11, wherein said resin coating is a flexible resin.

13. A method of making a board according to claim 12, wherein said flexible resin is made from a resin selected from a group of epoxy, polyimide, silicone, urethane, acrylic and polyamide resins.

14. A method of making a board according to claim 11, wherein said resin coating is formed by laminating with a flexible dry film resist.

15. A method of making a board according to claim 11, wherein said resin coating is formed by laminating with a flexible liquid film resist.

16. A method comprising:
   (1) providing a board selected from one of a film carrier, a flexible printed wiring board, and a hard printed wiring board;
   (2) punching a slit in a part of the board corresponding to a position where the board is to be bent;
   (3) forming a metal laminate on the board;
   (4) etching the metal laminate to form a conductive pattern on said board and over the slit;
   (5) applying a resin coating onto the conductive pattern which is capable of resisting an external load applied during bending of said board;
   (6) curing the resin coating;
   (7) bending the board at the slit; and
   (8) installing the bent board in a liquid crystal panel.

* * * * *